(12) United States Patent
Guerrero et al.

(10) Patent No.: US 7,914,974 B2
(45) Date of Patent: Mar. 29, 2011

(54) ANTI-REFLECTIVE IMAGING LAYER FOR MULTIPLE PATTERNING PROCESS

(75) Inventors: Douglas J. Guerrero, Rolla, MO (US); Ramil-Marcelo L. Mercado, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 568 days.

(21) Appl. No.: 11/839,317

(22) Filed: Aug. 15, 2007

(65) Prior Publication Data

US 2008/0044772 A1    Feb. 21, 2008

Related U.S. Application Data

(60) Provisional application No. 60/822,823, filed on Aug. 18, 2006.

(51) Int. Cl.
G03F 7/26    (2006.01)
(52) U.S. Cl. ........................... 430/312; 430/314
(58) Field of Classification Search .............. 430/311, 430/394, 312, 313
See application file for complete search history.

(56) References Cited

U.S. PATENT DOCUMENTS

| | | |
|---|---|---|
| 3,345,210 A | 10/1967 | Wilson |
| 3,561,962 A | 2/1971 | Ewing |
| 3,615,615 A | 10/1971 | Lincoln et al. |
| 3,629,036 A | 12/1971 | Isaacson |
| 3,682,641 A | 8/1972 | Casler et al. |
| 3,833,374 A | 9/1974 | Patrick |
| 3,856,751 A | 12/1974 | Wilson |
| 3,873,361 A | 3/1975 | Franco et al. |
| 3,894,163 A | 7/1975 | Broyde |
| 3,976,524 A | 8/1976 | Feng |
| 4,137,365 A | 1/1979 | Wydeven et al. |
| 4,175,175 A | 11/1979 | Johnson et al. |
| 4,244,799 A | 1/1981 | Fraser et al. |
| 4,320,224 A | 3/1982 | Rose et al. |
| 4,346,163 A | 8/1982 | Takeyama et al. |
| 4,369,090 A | 1/1983 | Wilson et al. |
| 4,397,722 A | 8/1983 | Haller |
| 4,430,419 A | 2/1984 | Harada |
| 4,526,856 A | 7/1985 | Lewis et al. |

(Continued)

FOREIGN PATENT DOCUMENTS

EP        1 033 624 A1    6/2000

(Continued)

OTHER PUBLICATIONS

International Search Report and Written Opinion dated Aug. 20, 2010 in related case PCT/US2010/020199 filed on Jan. 6, 2010.

(Continued)

Primary Examiner — Kathleen Duda
Assistant Examiner — Caleen O Sullivan
(74) Attorney, Agent, or Firm — Hovey Williams LLP (57) ABSTRACT

Novel methods of double patterning a photosensitive resin composition are provided. The methods involve applying the photosensitive composition to a substrate and thermally crosslinking the composition. The crosslinked layer can be used to provide reflection control. Upon exposure to light, the crosslinked polymer (or oligomer or monomer) in the compositions will decrosslink, rendering the light-exposed portions soluble in typical photoresist developing solutions (e.g., alkaline developers). Advantageously, the crosslinked portions of the composition remain insoluble in the solvent used to form the photosensitive composition. As a result, the coating, lithographic, and or developing steps can be repeated multiple times in varying order, depending upon the particular process, without destroying earlier-formed patterns.

20 Claims, 3 Drawing Sheets

U.S. PATENT DOCUMENTS

| | | | |
|---|---|---|---|
| 4,568,631 A * | 2/1986 | Badami et al. | 430/315 |
| 4,578,328 A | 3/1986 | Kray | |
| 4,647,517 A | 3/1987 | Hersener et al. | |
| 4,683,024 A | 7/1987 | Miller et al. | |
| 4,732,841 A | 3/1988 | Radigan | |
| 4,738,916 A | 4/1988 | Namatsu et al. | |
| 4,742,152 A | 5/1988 | Scola | |
| 4,803,147 A | 2/1989 | Mueller et al. | |
| 4,808,513 A | 2/1989 | Lazarus et al. | |
| 4,845,265 A | 7/1989 | Lapin et al. | |
| 4,891,303 A | 1/1990 | Garza et al. | |
| 4,910,122 A | 3/1990 | Arnold et al. | |
| 4,927,736 A | 5/1990 | Mueller et al. | |
| 4,996,247 A | 2/1991 | Nelson et al. | |
| 5,057,399 A | 10/1991 | Flaim et al. | |
| 5,066,566 A | 11/1991 | Novembre | |
| 5,089,593 A | 2/1992 | Fjare et al. | |
| 5,091,047 A | 2/1992 | Cleeves et al. | |
| 5,106,718 A | 4/1992 | Bartmann et al. | |
| 5,126,231 A | 6/1992 | Levy | |
| 5,137,780 A | 8/1992 | Nichols et al. | |
| 5,169,494 A | 12/1992 | Hashimoto et al. | |
| 5,198,153 A | 3/1993 | Angelopoulos et al. | |
| 5,246,782 A | 9/1993 | Kennedy et al. | |
| 5,302,548 A | 4/1994 | Watanabe et al. | |
| 5,304,626 A | 4/1994 | Burgess et al. | |
| 5,336,925 A | 8/1994 | Moss et al. | |
| 5,340,684 A | 8/1994 | Hayase et al. | |
| 5,370,969 A | 12/1994 | Vidusek | |
| 5,397,684 A | 3/1995 | Hogan et al. | |
| 5,403,438 A | 4/1995 | Motoyama | |
| 5,443,941 A | 8/1995 | Bariya et al. | |
| 5,542,971 A | 8/1996 | Auslander et al. | |
| 5,545,588 A | 8/1996 | Yoo | |
| 5,554,473 A | 9/1996 | Cais et al. | |
| 5,607,824 A | 3/1997 | Fahey et al. | |
| 5,632,910 A | 5/1997 | Nagayama et al. | |
| 5,633,210 A | 5/1997 | Yang et al. | |
| 5,667,940 A * | 9/1997 | Hsue et al. | 430/312 |
| 5,688,987 A | 11/1997 | Meador et al. | |
| 5,691,101 A | 11/1997 | Ushirogouchi et al. | |
| 5,739,254 A | 4/1998 | Fuller et al. | |
| 5,772,925 A | 6/1998 | Watanabe et al. | |
| 5,807,790 A | 9/1998 | Gupta et al. | |
| 5,892,096 A | 4/1999 | Meador et al. | |
| 5,922,503 A | 7/1999 | Spak et al. | |
| 5,925,578 A | 7/1999 | Bae | |
| 5,939,235 A | 8/1999 | Kondo et al. | |
| 5,952,448 A | 9/1999 | Lee et al. | |
| 5,968,324 A | 10/1999 | Cheung et al. | |
| 5,972,560 A | 10/1999 | Kaneko et al. | |
| 5,998,569 A | 12/1999 | Hogan et al. | |
| 6,015,650 A | 1/2000 | Bae | |
| 6,020,269 A | 2/2000 | Wang et al. | |
| 6,042,997 A | 3/2000 | Barclay et al. | |
| 6,046,112 A | 4/2000 | Wang | |
| 6,054,254 A | 4/2000 | Sato et al. | |
| 6,063,547 A | 5/2000 | Ye et al. | |
| 6,071,662 A | 6/2000 | Carmichael et al. | |
| 6,103,456 A | 8/2000 | Tobben et al. | |
| 6,110,653 A | 8/2000 | Holmes et al. | |
| 6,121,098 A | 9/2000 | Strobl | |
| 6,124,077 A | 9/2000 | Imai et al. | |
| 6,127,070 A | 10/2000 | Yang et al. | |
| 6,136,511 A | 10/2000 | Reinberg et al. | |
| 6,136,679 A | 10/2000 | Yu et al. | |
| 6,156,658 A | 12/2000 | Wang et al. | |
| 6,156,665 A | 12/2000 | Hamm et al. | |
| 6,162,580 A | 12/2000 | Matsuoka et al. | |
| 6,165,695 A | 12/2000 | Yang et al. | |
| 6,171,763 B1 | 1/2001 | Wang et al. | |
| 6,187,509 B1 | 2/2001 | Imai et al. | |
| 6,200,907 B1 | 3/2001 | Wang et al. | |
| 6,207,238 B1 | 3/2001 | Affinito | |
| 6,218,292 B1 | 4/2001 | Foote | |
| 6,232,386 B1 | 5/2001 | Vargo et al. | |
| 6,251,562 B1 | 6/2001 | Breyta et al. | |
| 6,268,108 B1 | 7/2001 | Iguchi et al. | |
| 6,268,282 B1 | 7/2001 | Sandhu et al. | |
| 6,291,145 B1 | 9/2001 | Kokubo et al. | |
| 6,306,560 B1 | 10/2001 | Wang et al. | |
| 6,309,789 B1 | 10/2001 | Takano et al. | |
| 6,309,926 B1 | 10/2001 | Bell et al. | |
| 6,309,955 B1 | 10/2001 | Subramanian et al. | |
| 6,316,165 B1 | 11/2001 | Pavelchek et al. | |
| 6,319,649 B1 | 11/2001 | Kato et al. | |
| 6,319,651 B1 | 11/2001 | Holmes et al. | |
| 6,338,936 B1 | 1/2002 | Ichikawa et al. | |
| 6,359,028 B1 | 3/2002 | Miya et al. | |
| 6,361,833 B1 | 3/2002 | Nakada et al. | |
| 6,380,611 B1 | 4/2002 | Yin et al. | |
| 6,383,952 B1 | 5/2002 | Subramanian et al. | |
| 6,391,472 B1 | 5/2002 | Lamb | |
| 6,410,209 B1 | 6/2002 | Adams et al. | |
| 6,426,125 B1 | 7/2002 | Yang et al. | |
| 6,428,894 B1 | 8/2002 | Babich et al. | |
| 6,440,640 B1 | 8/2002 | Yang et al. | |
| 6,451,498 B1 | 9/2002 | Pirri et al. | |
| 6,455,416 B1 | 9/2002 | Subramanian et al. | |
| 6,458,509 B1 | 10/2002 | Haruta | |
| 6,458,705 B1 | 10/2002 | Hung et al. | |
| 6,487,879 B1 | 12/2002 | Blackwell et al. | |
| 6,488,509 B1 | 12/2002 | Ho et al. | |
| 6,509,137 B1 | 1/2003 | Wang et al. | |
| 6,558,819 B1 | 5/2003 | Igarashi | |
| 6,566,280 B1 | 5/2003 | Meagley et al. | |
| 6,576,409 B2 | 6/2003 | Ichikawa et al. | |
| 6,586,560 B1 | 7/2003 | Chen et al. | |
| 6,602,652 B2 | 8/2003 | Adams et al. | |
| 6,616,692 B1 | 9/2003 | Glick et al. | |
| 6,638,853 B1 | 10/2003 | Sue et al. | |
| 6,680,252 B2 | 1/2004 | Chen et al. | |
| 6,709,979 B2 | 3/2004 | Komai et al. | |
| 6,740,469 B2 | 5/2004 | Krishnamurthy et al. | |
| 6,767,689 B2 | 7/2004 | Pavelchek et al. | |
| 6,803,168 B1 | 10/2004 | Padmanaban et al. | |
| 6,803,172 B2 | 10/2004 | Jung et al. | |
| 6,838,223 B2 | 1/2005 | Yoon et al. | |
| 6,844,131 B2 | 1/2005 | Oberlander et al. | |
| 6,849,293 B2 | 2/2005 | Rawat | |
| 6,852,473 B2 | 2/2005 | Roberts et al. | |
| 6,852,474 B2 | 2/2005 | Sabnis | |
| 6,872,506 B2 | 3/2005 | Neef et al. | |
| 6,893,702 B2 | 5/2005 | Takahashi | |
| 6,924,228 B2 | 8/2005 | Kim et al. | |
| 6,976,904 B2 | 12/2005 | Li et al. | |
| 7,074,527 B2 | 7/2006 | Lu et al. | |
| 7,108,958 B2 | 9/2006 | Guerrero | |
| 7,261,997 B2 | 8/2007 | Cox et al. | |
| 7,265,431 B2 | 9/2007 | Sivakumar | |
| 2002/0009599 A1 | 1/2002 | Welch et al. | |
| 2002/0031729 A1 | 3/2002 | Trefonas, III et al. | |
| 2002/0076642 A1 | 6/2002 | Zampini et al. | |
| 2002/0106898 A1 | 8/2002 | Tsai | |
| 2002/0110665 A1 | 8/2002 | Rutter, Jr. et al. | |
| 2002/0120070 A1 | 8/2002 | Hong et al. | |
| 2002/0120091 A1 | 8/2002 | Scott | |
| 2002/0160211 A1 | 10/2002 | Kurita et al. | |
| 2002/0182874 A1 | 12/2002 | Wang | |
| 2002/0183426 A1 | 12/2002 | Lamb et al. | |
| 2003/0017688 A1 | 1/2003 | Hsu et al. | |
| 2003/0040179 A1 | 2/2003 | Thakar et al. | |
| 2003/0049566 A1 | 3/2003 | Sabnis et al. | |
| 2003/0064608 A1 | 4/2003 | Sabnis et al. | |
| 2003/0122269 A1 | 7/2003 | Weber et al. | |
| 2003/0129531 A1 | 7/2003 | Oberlander et al. | |
| 2003/0129547 A1 | 7/2003 | Neisser et al. | |
| 2003/0143404 A1 | 7/2003 | Welch et al. | |
| 2003/0162120 A1 | 8/2003 | Yoon et al. | |
| 2003/0194636 A1 | 10/2003 | Wanat et al. | |
| 2003/0215736 A1 | 11/2003 | Oberlander et al. | |
| 2004/0010062 A1 | 1/2004 | Ahn et al. | |
| 2004/0018451 A1 | 1/2004 | Choi | |
| 2004/0053141 A1 * | 3/2004 | Pierrat | 430/5 |
| 2004/0058275 A1 | 3/2004 | Neef et al. | |
| 2004/0077173 A1 | 4/2004 | Sivakumar | |
| 2004/0210034 A1 | 10/2004 | Cox et al. | |

| | | | |
|---|---|---|---|
| 2004/0220379 | A1 | 11/2004 | Park et al. |
| 2005/0074699 | A1 | 4/2005 | Sun et al. |
| 2005/0148170 | A1 | 7/2005 | Bhave et al. |
| 2005/0214674 | A1 | 9/2005 | Sui et al. |
| 2005/0255410 | A1* | 11/2005 | Guerrero et al. ............. 430/311 |
| 2006/0019455 | A1 | 1/2006 | Bu et al. |
| 2006/0063106 | A1 | 3/2006 | Cox et al. |
| 2006/0160028 | A1* | 7/2006 | Lee et al. ................. 430/312 |
| 2007/0018286 | A1 | 1/2007 | Chen |
| 2007/0117049 | A1 | 5/2007 | Guerrero et al. |
| 2007/0196772 | A1 | 8/2007 | Jung |
| 2007/0207406 | A1 | 9/2007 | Guerrero et al. |
| 2007/0212649 | A1 | 9/2007 | Lalbahadoersing et al. |
| 2007/0212654 | A1* | 9/2007 | Larson et al. ............... 430/322 |
| 2007/0264830 | A1 | 11/2007 | Huang et al. |
| 2009/0111281 | A1 | 4/2009 | Bencher et al. |

FOREIGN PATENT DOCUMENTS

| | | |
|---|---|---|
| EP | 1 061 560 | 12/2000 |
| EP | 1480081 | 11/2004 |
| EP | 1 845 416 | 10/2007 |
| GB | 2 288 184 | 11/1995 |
| JP | 48000891 | 1/1973 |
| JP | 06-295064 A | 10/1994 |
| JP | 07335884 | 12/1995 |
| JP | 08-062401 A | 3/1996 |
| JP | 10149531 | 6/1998 |
| JP | 10307394 | 11/1998 |
| JP | 2003-162065 | 6/2003 |
| JP | 2003-183387 | 7/2003 |
| JP | 2005-70154 | 3/2005 |
| KR | 1997-0071126 | 11/1997 |
| KR | 1020010007323 | 1/2001 |
| WO | WO 2004/113417 A1 | 12/2004 |
| WO | 2005001901 | 1/2005 |
| WO | WO2005093513 | 10/2005 |
| WO | WO2005111719 | 11/2005 |

OTHER PUBLICATIONS

Tseng et al., "A comprehensive comparison between double patterning and double patterning with spacer on sub-50nm product implementation," Proceedings of SPIE, vol. 6924, 2008, paper 69241Y.

Huang et al., "A new method to characterize conformality of BARC coatings," Proceedings of SPIE, vol. 5753, 2005, pp. 627-635.

Bencher, "SADP: The best option for <32nm NAND flash," Nanochip Technology Journal, vol. 5, No. 2, 2007, pp. 8-13.

International Search Report and Written Opinion dated Aug. 20, 2009 in related case PCT/US2009/032446 filed on Jan. 29, 2009.

International Preliminary Report on Patentability dated Aug. 12, 2010 in related case PCT/US2009/032446 filed on Jan. 29, 2009.

"Synthesis and Characterizations of Photodefinable Polycarbonates for Use as Sacrificial Materials in the Fabrication of Microfludic Devices," White et al., School of Chemical Engineering, Georgia Institute of Technology, Atlanta, GA 30332-0100, Advances in Resist Technology and Processing XIX, Theodore H. Fedynyshyn, Editor, Proceedings of SPIE, vol. 4690 (2002), pp. 242-253.

"Removable Organic Antireflection Coating", Sturtevant et al., Advances in Resist Technology and Processing XIII, Roderick R. Kunz, Chair/Editor, SPIE, vol. 2724, pp. 738-746 (Mar. 1996).

"Compatibility of Chemically Amplified Photoresists with Bottom Anti-Reflective Coatings," Yoshino et al., Advances in Resist Technology and Processing XV, Will Conley, Chair/Editor, SPIE, vol. 3333, pp. 655-661 (Feb. 1998).

"Limits of Ultrathin Resist Processes," Okoroanyanwu, Future Fab Intl., Sep. 2003, pp. 1-15, http://www.future-fab.com/login.asp?s_id=0&d_ID=1158&login=true&mode=print.

Translated Abstract of JP Pub No. JP 48000891, Jan. 1973, 1 page.

Translation of JP Pub No. JP 10307394, Nov. 1998, 33 pages.

Translation of JP Pub No. JP 10-149531, Jun. 1998, 17 pages.

Translation of JP Pub No. JP 08-062401A, Mar. 1996, 7 pages.

Translated Abstract of JP No. 2005-70154, Mar. 17, 2005, 1 page.

Yamada et al., "Positive and Negative Tone Water Processable Photoresist: A Progress Report," SPIE vol. 3333, pp. 245-253 (1998).

Yamada et al., "The Design and Study of Aqueous-Processable Positive Tone Photoresists," SPIE vol. 3999. pp. 569-578 (2000).

Moon et al, "Three-Component Photopolymers Based on Thermal Cross-Linking and Acidolytic De-Cross-Linking of Vinyl Ether Groups. Effects of Binder Polymers on Photopolymer Characteristics," Chemistry of Materials, vol. 6, No. 10, Oct. 1994, pp. 1854-1860.

Translation of JP Pub No. JP 06-295064, Oct. 21, 1994, 16 pages.

Lee et al., "Performance of Vinyl Ether Cross-Linkers on Resist for 193 nm Lithography," SPIE vol. 4690, pp. 541-548 (2002).

"Aqueous Processable Positive and Negative Tone Photoresists," Willson Research Group, University of Texas at Austin, Apr. 18, 2001, http://willson.cm.utexas.edu/Research/Sub_Files/Water_Soluble, 7 pages.

Guerrero et al., "Photochemical Studies on Bottom Anti-Reflective Coatings," Journal of Photopolymer Science and Technology, vol. 19, No. 3, 2006, pp. 343-347.

Mack, "Antireflective Coatings," Microlithography World, Summer 1997, pp. 29-30.

Rubin et al, "Ion Implantation in Silicon Technology," American Institute of Physics, Jun./Jul. 2003, pp. 12-15.

Case Technology Inc., Ion Implantation, www.casetechnology.com/links.html, pp. 1-24, (1996).

2.2.3 Implantation Dose, www.iue.tuwien.ac.at/phd/hoessinger/node23.html, 1 page, (2000).

2.2.2 Ion Beam Energy, www.iue.tuwien.ac.at/phd/hoessinger/node22.html, 5 pages, (2000).

2.2.4 Tilt and Twist Angle, www.iue.tuwien.ac.at/phd/hoessinger/node24.html, 2 pages, (2000).

2.2 Ion Implantation Process Parameters, www.iue.tuwien.ac.at/phd/hoessinger/node20.html, 1 page, (2000).

2.2.1 Dopant Species, www.iue.tuwien.ac.at/phd/hoessinger/node21.html, 2 pages, (2000).

Ion Implantation Process, p2library.nfesc.navy.mil/P2_Opportunity_Handbook/1_12.html, 6 pages, (2006).

Translation of JP Pub No. 2003-162065; Jan. 2008, 19 pages.

Okazaki Masaki et al., "Positive-Working Photosensitive Alakline-Developable Polyimide Precursor Based on Semi-Alicyclic Poly (amide acid), Vinyl Ether Crosslinker, and a Photoacid Generator," J. Photopolym Sci Technol, vol. 19, No. 2, p. 277-280, Apr. 1, 2006.

* cited by examiner

ANTI-REFLECTIVE IMAGING LAYER FOR MULTIPLE PATTERNING PROCESS

RELATED APPLICATIONS

This application claims the priority benefit of a provisional application entitled ANTI-REFLECTIVE IMAGING LAYER FOR MULTIPLE PATTERNING PROCESS, Ser. No. 60/822,823, filed Aug. 18, 2006, incorporated by reference herein

BACKGROUND OF THE INVENTION

1. Field of the Invention

The present invention is broadly concerned with novel, double patterning methods that utilize a thermally crosslinkable, photosensitive composition.

2. Description of the Prior Art

Trends toward improving the photolithography process include the use of high numerical aperture (NA) tools and/or immersion fluids. Using imaging tools with high NA capabilities (>1.0) by themselves or in combination with immersion provides a method to achieve higher resolution of patterns with smaller critical dimension and higher density. These advances are possible because of the larger amount of light that can be transferred to the imaging layer. However, these options are quite costly and require new tool sets.

Multi-patterning techniques, have been used to attempt to achieve high-density lithography. However, these are lacking in that photoresist patterns are destroyed by repeated photoresist applications.

There is a need for improved methods to allow higher-density patterning utilizing presently available equipment.

SUMMARY OF THE INVENTION

The present invention overcomes these problems by broadly providing a method of forming a microelectronic structure. The method comprises applying a photosensitive composition to the surface of a substrate to form an imaging layer adjacent the substrate surface. The components (e.g., polymers, oligomers, compounds) in the imaging layer are then crosslinked, and the layer is exposed to light to yield light-exposed portions in said layer that have been chemically modified as a result of this light exposure. The imaging layer is contacted with a developer, preferably an aqueous alkaline developer, so as to remove the light-exposed portions from the substrate and form a patterned imaging layer.

A second photosensitive composition is then added to form a second imaging layer on the patterned imaging layer. This is accomplished without first heating the patterned imaging layer, which would have been essential in prior art processes. That second imaging layer can then be patterned and developed, and this coating/patterning/developing process can be repeated multiple times if desired. After the process has been repeated sufficiently to form the desired pattern in the imaging layer, that pattern can be transferred to the substrate.

In another embodiment, the crosslinked imaging layer is exposed to light to yield the light-exposed portions in said layer. Then, the layer is subjected to one or more additional light-exposure steps, with each step yielding more light-exposed portions in the imaging layer. After the desired exposures have occurred, a single development step can be carried out to remove all light-exposed portions, yielding a patterned imaging layer that can ultimately be transferred to the substrate. Alternatively, a development step can be carried out after each light exposure step in order to remove the light-exposed portions prior to the next light exposure step.

DETAILED DESCRIPTION OF THE PREFERRED EMBODIMENTS

The Inventive Method

Figure 1:
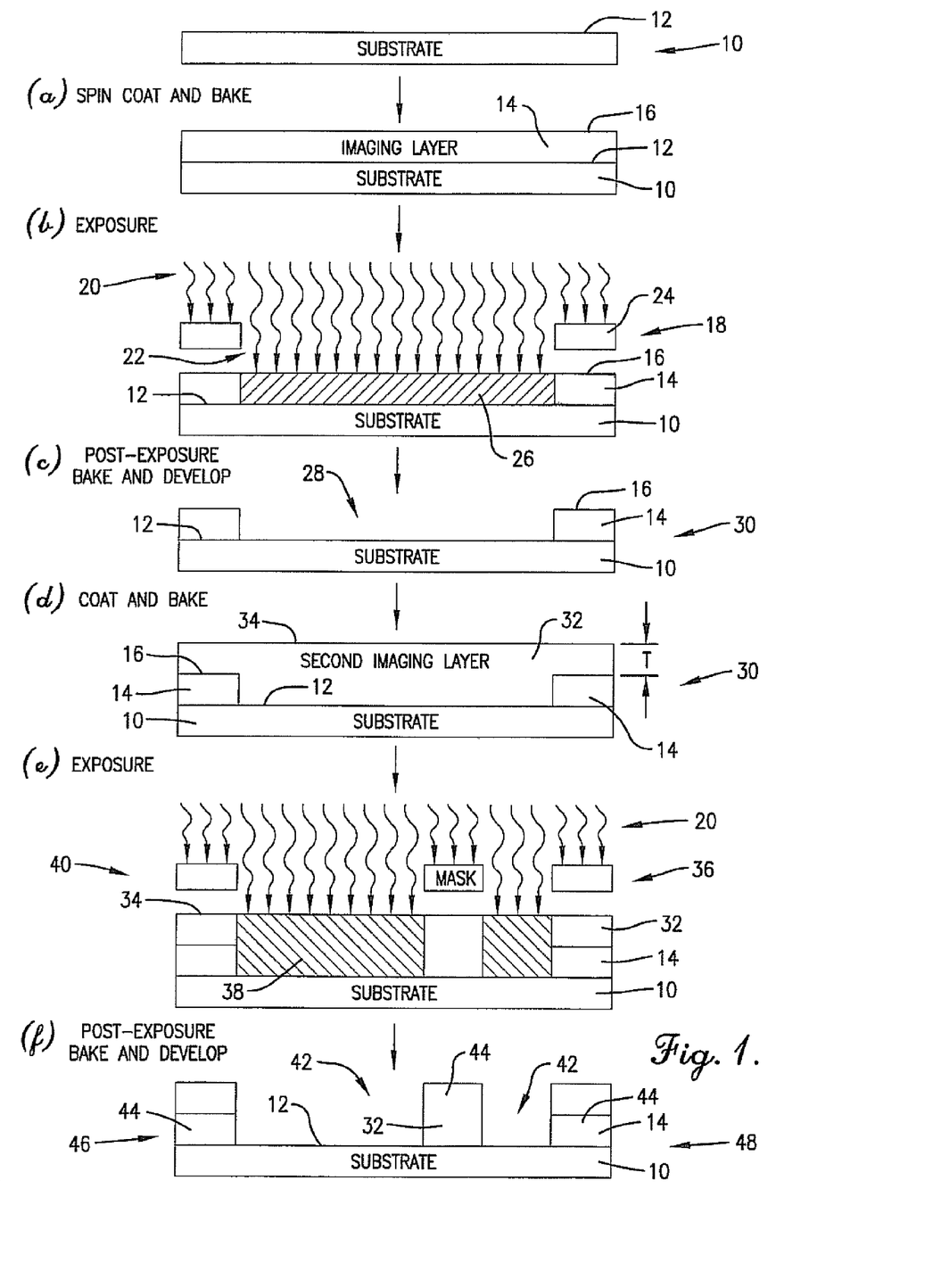
FIG. 1 is a schematic drawing illustrating a process according to the invention

FIG. 1 illustrates one embodiment of the inventive process. A substrate 10 having an upper surface 12 is provided. Any conventional microelectronic substrate can be utilized, including substrates comprising one or more of the following: silicon, aluminum, tungsten, tungsten silicide, gallium arsenide, germanium, tantalum, tantalum nitride, SiGe, and mixtures of the foregoing.

As shown in step (a), a thermally crosslinkable and photochemically decrosslinkable composition is applied to the surface 12 to form an imaging layer 14 having an upper surface 16. The composition can be applied by any known application method, with one preferred method being spin-coating the composition at speeds of from about 750 rpm to about 3,500 rpm (preferably from about 1,000 rpm to about 2,500 rpm) for a time period of from about 10 seconds to about 120 seconds (preferably from about 20 seconds to about 60 seconds).

The layer 14 is then baked so as to induce thermal crosslinking of the layer 14. Preferred baking conditions involve temperatures of at least about 100° C., preferably from about 100° C. to about 250° C., and more preferably from about 120° C. to about 200° C., and for time periods of from about 10 seconds to about 90 seconds. The thickness of the crosslinked imaging layer 14 will typically be from about 10 nm to about 150 nm, and preferably from about 30 nm to about 80 nm.

The crosslinked layer 14 will be sufficiently crosslinked that it will be substantially insoluble in typical photoresist solvents (including the solvent that was present in the photosensitive composition used to form layer 14). Thus, when subjected to a stripping test, the crosslinked layers 14 will have a percent stripping of less than about 5%, preferably less than about 1%, and even more preferably about 0%. The stripping test involves first determining the thickness (by taking the average of measurements at five different locations) of the cured layer. This is the initial average film thickness. Next, a solvent (e.g., ethyl lactate, PGME, PGMEA) is puddled onto the cured film for about 10 seconds, followed by spin drying at about 2,000-3,500 rpm for about 20-30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

In the embodiment of FIG. 1, the best use of layer 14 would typically be simply as an imaging layer. In these instances, the k value (imaginary component of the complex index of refraction) is preferably from about 0 to about 0.5.

At step (b), a mask 18 is positioned above the surface 16 of imaging layer 14, and light 20 is directed at the mask 18. The mask 18 has open areas 22 designed to permit light to pass by the mask 18 and contact surface 16 of imaging layer 14. The remaining solid portions 24 of mask 18 are designed to prevent light from contacting surface 16 of imaging layer 14 in certain areas. Those skilled in the art will readily understand that the arrangement of open areas 22 and solid portions 24 is designed based upon the desired pattern to be formed in imaging layer 14 and ultimately in the substrate surface 12. The present inventive process can be used with UV light of most wavelengths, but wavelengths of 157 nm, 193 nm, 248 nm, and 365 nm are most preferred.

Upon being exposed to light, the portions 26 of the imaging layer 14 that are exposed to light undergo a photochemical reaction so that the layer 14 is photochemically decrosslinked. More specifically, an acid is generated from the PAG upon exposure to light, and this acid "decrosslinks" the polymer, oligomer, or compound in the layer. That is, the acid catalyzes the breaking of the bond that was formed between the polymer, oligomer, or compound and the crosslinker upon thermal crosslinking. After light exposure the imaging layer 14 is preferably subjected to a post-exposure bake (as used herein, post-exposure bakes are carried out at a temperature of less than about 150° C., preferably less than about 140° C., and more preferably from about 90° C. to about 140° C. for a time period of from about 30 seconds to about 90 seconds).

Advantageously, the light-exposed portion 26, which was made developer soluble with the above steps, is contacted with a developer as shown in step (c). The developer removes the portions 26 of imaging layer 14 to leave behind openings 28. Openings 28 can be holes, trenches, spaces, etc., and will ultimately be transferred to the substrate 10. "Developer soluble" as used herein means the portions 26 that have been exposed to light can be substantially removed with conventional aqueous developers such as tetramethyl ammonium hydroxide and KOH developers. At least about 95%, preferably at least about 99%, and even more preferably 100% of the portions will be removed by a base developer such as tetramethyl ammonium hydroxide and/or KOH developers.

The inventive process is particular advantageous in that it is a double-patterning process. That is, the stack 30 that has been coated, subjected to lithography, and developed, can now be coated, subjected to lithography, and developed again to create further patterns, Referring to step (d), a thermally crosslinkable and photochemically decrosslinkable composition is applied to form a second imaging layer 32 having an upper surface 34. Because the imaging layer 14 was crosslinked, this second coating step is possible while still maintaining the previously-formed pattern intact. Furthermore, this layer remains intact without requiring an additional heating (hardening) step to be carried out on the imaging layer 14. So, in this embodiment and in all embodiments of this application, the only heating steps occur during thermal crosslinking and during any post-exposure bakes.

The composition application would be similar to that described above with respect to step (a). Furthermore, one would typically use the same thermally crosslinkable and photochemically decrosslinkable composition used in the earlier step (a), but this is not required, and different compositions (e.g., a conventional photoresist for the second photosensitive composition) could be used if desired. The same baking conditions would be followed as described in step (a), and the thickness "T" of the second imaging layer 32 on top of the highest remaining portion of imaging layer 14 would also be the same as described above with step (a).

In step (e), a mask 36 having the desired pattern formed therein is positioned over surface 34 of second imaging layer 32, and light exposure is repeated as described in step (b) above. Exposed portions 38 are formed in second imaging layer 32, and the stack 40 is preferably subjected to a post-exposure bake followed by contact with a developer (step (f)). This results in the removal of exposed portions 38 to leave behind openings 42. Again, these openings 42 can be holes, trenches, or spaces. The raised portions 44 remaining on substrate surface 12 are typically referred to as lines or raised features. This pattern of holes, trenches, spaces, lines, and raised features will ultimately be transferred to the substrate 10.

The above coating, baking, light exposure, optional post-exposure baking, and developing steps can be repeated as many more times as desired and as is feasible for the particular pattern 46 to be formed in substrate surface 12. The stack 48, which comprises substrate 10 and pattern 46 on substrate surface 12, is then subjected to an etching process (e.g., plasma etch), whereby the pattern 46 is transferred to the substrate 10, so that substrate 10 now includes the openings 42 and portions 44 formed therein. It will be appreciated that it is not necessary to perform any etching steps prior to this point in the process. That is, steps (a)-(f) are carried out without any etching occurring. Half pitch dimensions of less than about 50 nm can be achieved with this method. The patterned substrate is then subjected to further fabrication steps (e.g., metallization).

Figure 2:
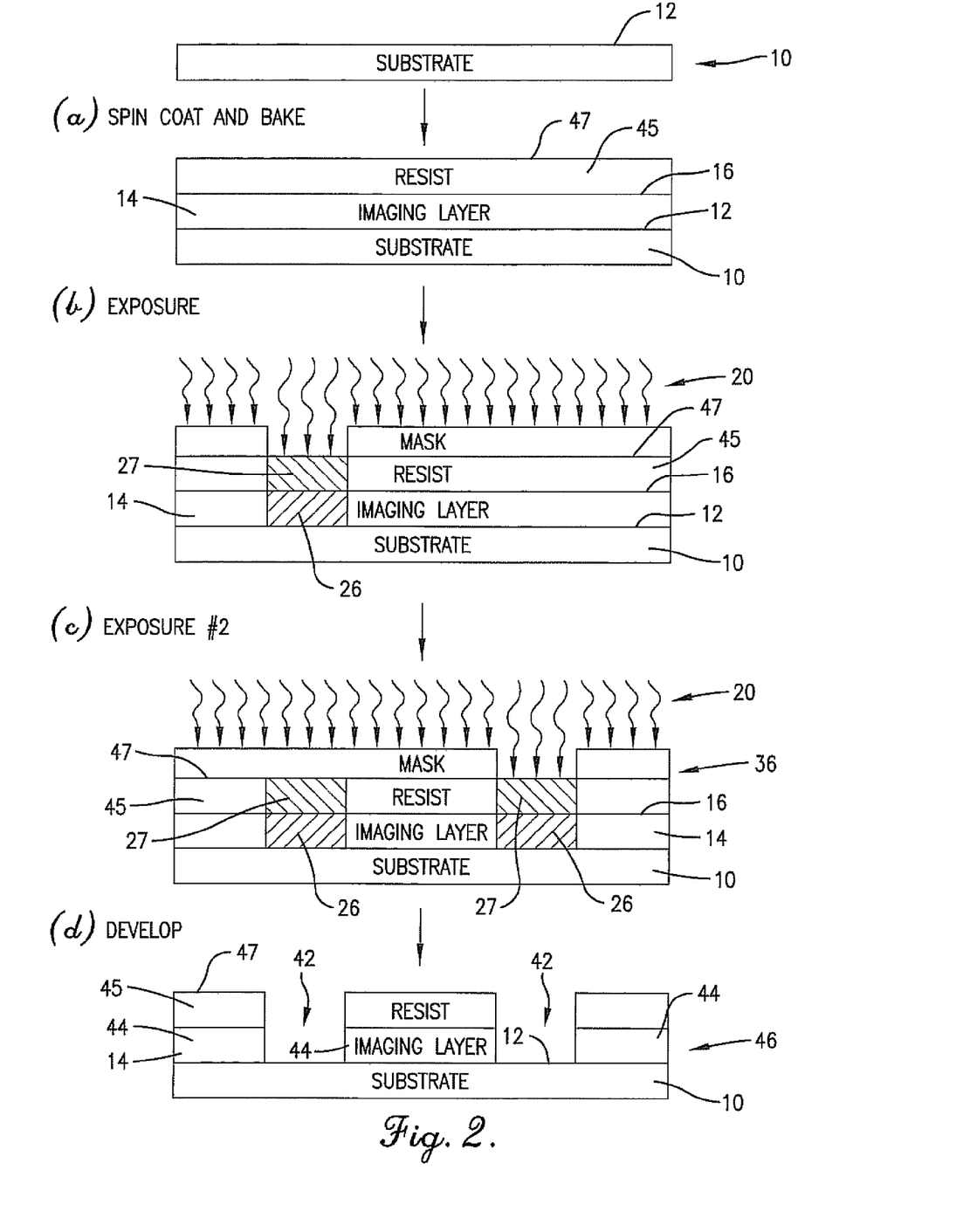
FIG. 2 is a schematic drawing illustrating a second embodiment of the inventive process.

FIG. 2 illustrates a second embodiment of the inventive process. Like numbering is used for all embodiments to designate similar materials. The same process conditions (e.g., spin speeds, temperatures, time periods, wavelengths) as well as compositions, substrates, developers, and masks used as in FIG. 1 would be used in this embodiment.

In the embodiment of FIG. 2, a photoresist 45 having an upper surface 47 is applied (e.g., via spin-coating) to the upper surface 16 of imaging layer 12 after thermal crosslinking of imaging layer 12. During exposure step (b), the light also chemically alters portion 27 of resist 45 to make it more soluble in typical developers. After this exposure step (b) (and the optional post-exposure bake), the stack is not developed but is instead immediately subjected to a second exposure step (c), where another mask 36 is utilized to create the second pattern in imaging layer 26 and photoresist 45. This could be followed with more exposure steps with other masks, if desired. Once the desired number of exposure steps has been carried out, the imaging layer 14 and photoresist 45 are developed (step (d)) to yield patterned layer 46. Conventional etching, metallization, etc., can then be carried out to complete the device manufacture.

Figure 3:
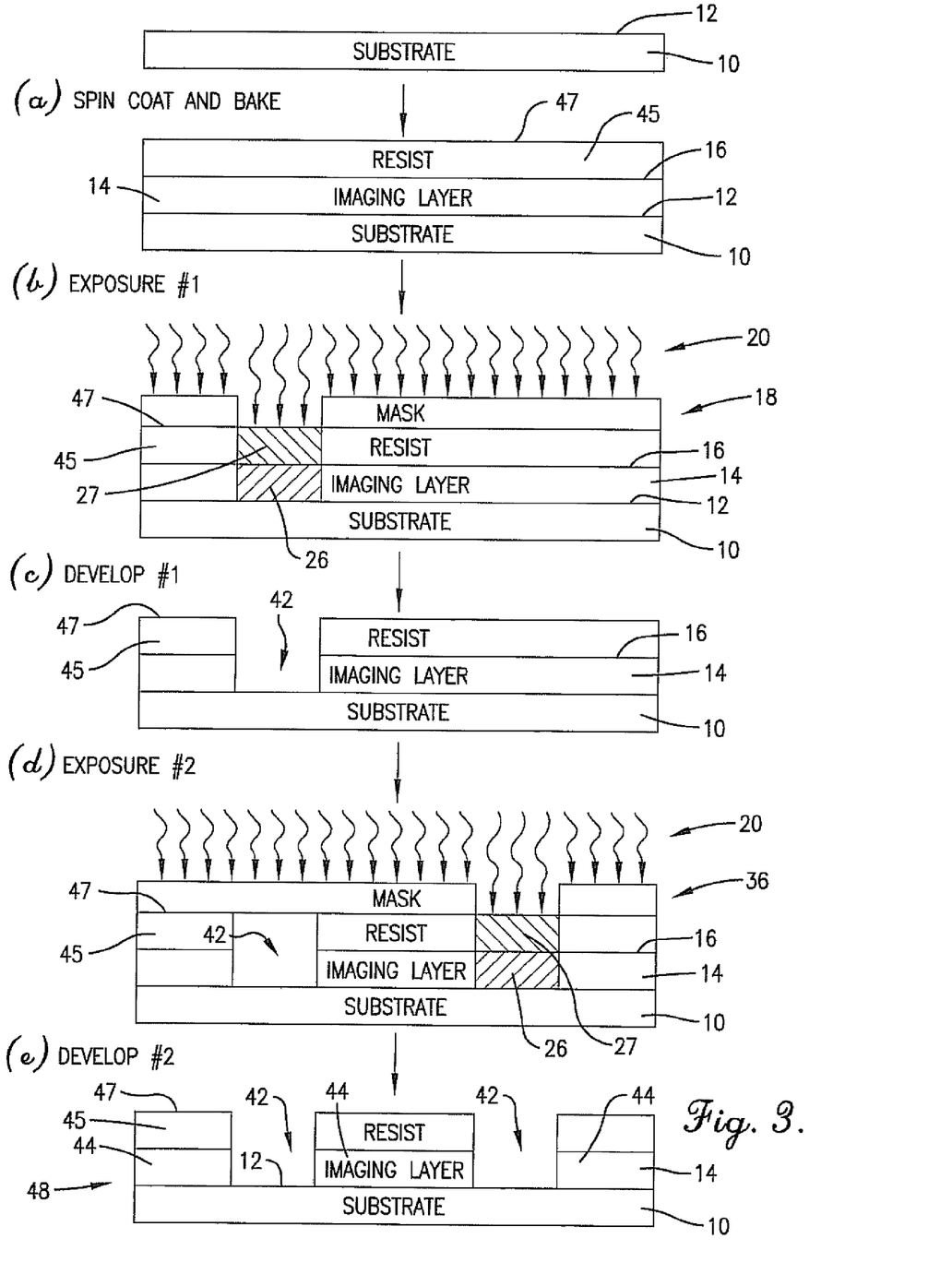
FIG. 3 is a schematic drawing illustrating a third embodiment of the inventive process.

In the embodiment of FIG. 3, a photoresist 45 is also utilized as was the case in FIG. 2. After exposure step (b), the stack is developed (step (c)) similar to the embodiment of FIG. 1. However, rather than being subjected to a second coating step as was done in the embodiment of FIG. 1, imaging layer 14 and the photoresist 45 are subjected to a second exposure step (d) with a second mask 36 to expose other portions of layer 14 and resist 45 to light. After this exposure, the imaging layer 14 and resist 45 are subjected to a second developing step (e) to further pattern the layers. This exposure-develop sequence can be repeated as many times as desired, after which the stack 48 is etched to transfer the pattern to the substrate 10, followed by subsequent processing such as metallization.

In the embodiments of FIGS. 2 and 3, it will again be appreciated that it is not necessary to perform any etching steps prior to this point in the process. That is, steps (a)-(d) of FIG. 2 and steps (a)-(e) of FIG. 3 are carried out without any etching occurring. Furthermore, the process can be repeated with multiple photoresist layers (of the same or different chemical composition) as desired for the particular process.

In the embodiments of FIGS. 2 and 3, the layer 14 would typically be functioning as a bottom anti-reflective coating. In these instances, the crosslinked layers will be formulated to provide superior light absorbance. The n value of the crosslinked layer 14 would be at least about 1.3, and preferably from about 1.4 to about 2.0, while the k value will be least about 0.1, and preferably from about 0.2 to about 0.5, at the wavelength of use (e.g., 157 nm, 193 nm, 248 nm, 365 nm). The OD of the cured layers will be at least about 5/µm, preferably from about 5-15/µm, and even more preferably from about 10-15 µm, at the wavelength of use (e.g., 157 nm, 193 nm, 248 nm, 365 nm).

When being used as a bottom anti-reflective coating, it is preferred that the compositions be applied in quantities such that the thickness of the layer 14 after curing or crosslinking will be within about 20% of the first maximum thickness of the composition. The first maximum thickness of a composition is defined as:

$$\text{First Maximum Thickness} = \frac{\lambda}{2n},$$

where λ is the wavelength of use, and n is the real component of the refractive index of the composition. Even more preferably, the thickness of the crosslinked layer 14 is within about 15%, even more preferably within about 10%, and even more preferably within about 5% of the first maximum thickness of the composition. The use of the photosensitive composition at these thicknesses results in improved properties, including the ability to print structures with critical dimension control and to provide adequate coverage for reflection control over topography.

Compositions for Use in the Invention Method

As mentioned above, the composition used for the present process should be thermally crosslinkable and photosensitive (i.e., photochemically decrosslinkable). The preferred compositions will comprise a crosslinkable polymer, oligomer, and/or monomer dissolved or dispersed in a solvent system along with a photoacid generator (PAG) a crosslinker (referred to interchangeably with crosslinking agent).

Suitable polymers include those selected from the group consisting of aliphatic polymers, acrylates, methacrylates, polyesters, polycarbonates, novolaks, polyamic acids, polysulfonyl esters, polycarbonate-sulfones (i.e., polymers which include recurring monomers having both an —$SO_2$ group and a —$CO_3$ group), and mixtures thereof. Suitable solvent systems, crosslinkers, PAGs, and ingredient quantities include any of those discussed below.

One suitable composition is disclosed in U.S. patent application Ser. No. 11/683,309, incorporated by reference here. This type of composition comprises a compound selected from the group consisting of polymers, oligomers, and mixtures thereof dissolved or dispersed in a solvent system. The compound is preferably present in the composition at a level of from about 0.5-10% by weight, preferably from about 0.5-5% by weight, and more preferably from about 1-4% by weight, based upon the total weight of all ingredients in the composition taken as 100% by weight.

If the compound is a polymer, it is preferred that the average molecular weight be from about 1,000-100,000 Daltons, and more preferably from about 1,000-25,000 Daltons. Preferred polymers include those selected from the group consisting of aliphatic polymers, acrylates, methacrylates, polyesters, polycarbonates, novolaks, polyamic acids, and mixtures thereof.

If the compound is an oligomer, it is preferred that the molecular weight be from about 500-3,000 Daltons, and more preferably from about 500-1,500 Daltons. Preferred oligomers include substituted and unsubstituted acrylates, methacrylates, novolaks, isocyanurates, glycidyl ethers, and mixtures thereof.

Regardless of whether the compound is an oligomer or polymer, and regardless of the structure of the polymer backbone or oligomer core, it is preferred that the compound comprise an acid functional group. The acid group is preferably present in the compound at a level of at least about 5% by weight, preferably from about 5-90% by weight, and even more preferably from about 5-50% by weight, based upon the total weight of the compound taken as 100% by weight. Preferred acid groups are groups other than phenolics, such as carboxylic acids (—COOH).

Unlike prior art compositions, the acid group is preferably not protected by a protective group. That is, at least about 95%, preferably at least about 98%, and preferably about 100% of the acid groups are free of protective groups. A protective group is a group that prevents the acid from being reactive.

Because protective groups are not necessary with the present invention, it is also preferred that the compound is not acid-sensitive. An acid-sensitive polymer or oligomer is one that contains protective groups that are removed, decomposed, or otherwise converted in the presence of an acid.

In another embodiment, a combination of protected acid groups and unprotected acid groups could be utilized. In these embodiments, the molar ratio of protected acid groups to unprotected acid groups is from about 1:3 to about 3:1, and more preferably from about 1:2 to about 1:1.

In embodiments where the composition is being used as a bottom anti-reflective coating, the composition comprises a chromophore (light attenuating compound or moiety). The chromophore can be bonded with the compound (either to a functional group on the compound or directly to the polymer backbone or oligomer core), or the chromophore can simply be physically mixed in the composition. The chromophore should be present in the composition at a level of from about 5-50% by weight, and preferably from about 20-40% by weight, based upon the total weight of the compound taken as 100% by weight. The chromophore is selected based upon the wavelength at which the compositions will be processed. For example, at wavelengths of 248 nm, preferred chromophores include naphthalenes (e.g., naphthoic acid methacrylate, 3,7-dihydroxynaphthoic acid), heterocyclic chromophores, carbazoles, anthracenes (e.g., 9-anthracene methyl metacrylate, 9-anthracenecarboxylic acid), and functional moieties of the foregoing. At wavelengths of 193 nm, preferred chromophores include substituted and unsubstituted phenyls, heterocyclic chromophores (e.g., furan rings, thiophene rings), and functional moieties of the foregoing. The preferred inventive compositions will also include a crosslinker.

Preferred crosslinkers are vinyl ether crosslinkers. It is preferred that the vinyl ether crosslinkers be multi-functional, and more preferably tri- and tetra-functional.

Preferred vinyl ether crosslinkers have the formula where R is selected from the group consisting of aryls (preferably $C_6$-$C_{12}$) and alkyls (preferably $C_1$-$C_{18}$, and more preferably $C_1$-$C_{10}$), each X is individually selected from the group consisting of: alkyls (preferably $C_1$-$C_{18}$, and more preferably $C_1$-$C_{10}$); alkoxys (preferably $C_1$-$C_{18}$, and more preferably $C_1$-$C_{10}$); carboxys; and combinations of two or more of the foregoing, and n is 2-6. The most preferred vinyl ether crosslinkers include those selected from the group consisting of ethylene glycol vinyl ether, trimethylolpropane trivinyl ether, 1,4-cyclohexane dimethanol divinyl ether, and mixtures thereof. Another preferred vinyl ether crosslinker has a formula selected from the group consisting of The preferred compositions also contain a catalyst. The preferred catalyst is an acid generator, and particularly a PAG (both ionic and/or non-ionic). Any PAG that produces an acid in the presence of light is suitable. Preferred PAGs include onium salts (e.g., triphenyl sulfonium perfluorosulfonates such as triphenyl sulfonium nonaflate and triphenyl sulfonium triflate), oxime-sulfonates (e.g., those sold under the name CGI® by CIBA), and triazines (e.g., TAZ108® available from Midori Kagaku Company).

The compositions preferably comprise from about 0.1-10% by weight of catalyst, and more preferably from about 1-5% by weight of catalyst, based upon the total weight of the polymer and oligomer solids in the composition taken as 100% by weight.

Although a thermal acid generator ("TAG") can be included in the inventive compositions, in a preferred embodiment the composition is essentially free of TAGs. That is, any TAGs are present at very low levels of less than about 0.05% by weight, and preferably about 0% by weight, based upon the total weight of the composition taken as 100% by weight.

It will be appreciated that a number of other optional ingredients can be included in the compositions as well. Typical optional ingredients include surfactants, amine bases, and adhesion promoters.

The compositions of this embodiment are formed by simply dispersing or dissolving the polymers, oligomers, or mixtures thereof in a suitable solvent system, preferably at ambient conditions and for a sufficient amount of time to form a substantially homogeneous dispersion. The other ingredients (e.g., crosslinker, PAG) are preferably dispersed or dissolved in the solvent system along with the compound.

Preferred solvent systems of this embodiment include a solvent selected from the group consisting of propylene glycol methyl ether acetate (PGMEA), propylene glycol methyl ether (PGME), propylene glycol n-propyl ether (PnP), ethyl lactate (EL), and mixtures thereof. Preferably, the solvent system has a boiling point of from about 50-250° C., and more preferably from about 100-175° C. The solvent system should be utilized at a level of from about 80-99% by weight, and preferably from about 95-99% by weight, based upon the total weight of the composition taken as 100% by weight.

Another composition suitable for use in the present inventive methods is described in U.S. Pat. No. 7,108,958, incorporated by reference herein. The compositions in this embodiment include polymers selected from the group consisting of polycarbonates, polysulfonyl esters, and polycarbonate-sulfones.

In embodiments where the polymer is a polycarbonate, preferred polycarbonates comprise recurring monomers having the formula (I)

where each of $R^1$ and $R^2$ is individually selected from the group consisting of functional moieties of diols, including aliphatic (preferably $C_1$-$C_{12}$) diols, aromatic (preferably $C_4$-$C_{12}$) diols, and heterocyclic diols). Preferred diols include those selected from the group consisting of bisphenols.

In one embodiment, at least one of $R^1$ and $R^2$ is selected from the group consisting of functional moieties of the bisphenols (and preferably bisphenol P and/or bisphenol Z). In this embodiment, it is preferred that the other of $R^1$ and $R^2$ has the formula where $R^5$ is an alkyl group (substituted or unsubstituted, preferably $C_1$-$C_{12}$, and more preferably $C_1$-$C_6$), and Ar is an aryl group (substituted or unsubstituted, preferably at least $C_4$, more preferably $C_4$-$C_{12}$, and even more preferably $C_6$-$C_{10}$).

In another embodiment, when one of $R^1$ or $R^2$ is a moiety of bisphenol A, the other of $R^1$ and $R^2$ is a group other than or

-continued

Particularly preferred R¹ and R² groups include those having a structure selected from the group consisting of As used herein, the term "functional moiety" is intended to refer to moieties of compounds whose respective structures have been altered so that they may bond with other compounds. For example, the structure would be considered a functional moiety of bisphenol A, with the hydrogen atoms from each of the —OH groups originally present in the compound having been removed so that the oxygen atoms can bond with another compound or moiety.

In embodiments where the polymer is a polysulfonyl ester, the polymer preferably has the formula (II)

where $X^1$ is selected from the group consisting of functional moieties of diols and dioximes. Preferred diols include aliphatic (preferably $C_1$-$C_{12}$) diols, aromatic (preferably $C_4$-$C_{12}$) diols, and heterocyclic diols. Particularly preferred diols include those selected from the group consisting of the bisphenols. Preferred dioximes include aliphatic (preferably $C_1$-$C_{12}$) dioximes, aromatic (preferably $C_4$-$C_{12}$) dioximes, and heterocyclic dioximes. Particularly preferred dioximes include those derived from the condensation of an aliphatic diamine ($NH_2$-carbon chain-$NH_2$) and substituted or unsubstituted hydroxybenzaldehydes and hydroxyacetyl benzenes. One particularly preferred example is 1,4-diacetyl benzene dioxime.

In a preferred embodiments $X^1$ has the formula —O—Z—O— where Z is selected from the group consisting of substituted and unsubstituted aryls (preferably at least $C_4$, more preferably $C_4$-$C_{12}$, and even more preferably $C_6$-$C_{10}$), substituted and unsubstituted alkyls (preferably $C_1$-$C_{12}$, and more preferably $C_1$-$C_6$), and combinations thereof. Particularly preferred $X^1$ groups have a structure selected from the group consisting of

In formula (II), $X^2$ is selected from the group consisting of substituted and unsubstituted aryls (preferably at least $C_4$, more preferably $C_4$-$C_{12}$, and even more preferably $C_6$-$C_{10}$) and substituted and unsubstituted alkyls (preferably $C_1$-$C_{12}$, and more preferably $C_1$-$C_6$). Particularly preferred $X^2$ groups include those selected from the group consisting of phenyls, naphthyls, furyls, thionyls, and anthranyls. It is preferred that at least one of $X^1$ and $X^2$ includes an aromatic portion or other light absorbing group.

In embodiments where the polymer is a polycarbonate sulfone, a preferred structure for this polymer is (III)

where each of $R^3$ and $R^4$ is individually selected from the group consisting of substituted and unsubstituted aryls (preferably at least $C_4$, more preferably $C_4$-$C_{12}$, and even more preferably $C_6$-$C_{10}$), and alkyls (preferably $C_1$-$C_{12}$, and more preferably $C_1$-$C_6$).

At least one of $R^3$ and $R^4$ will include an —$SO_2$ group, and it is preferred that at least one of $R^3$ and $R^4$ includes an aromatic portion or other light absorbing group. Particularly preferred $R^3$ and $R^4$ groups include those selected from the group consisting of Preferably, the polymer has an average molecular weight of from about 1,000-100,000 Daltons, more preferably from about 2,000-50,000 Daltons, and even more preferably from about 2,000-20,000 Daltons.

The compositions of this embodiment are formed by simply dispersing or dissolving the polymer(s) in a suitable solvent system, preferably at ambient conditions and for a sufficient amount of time to form a substantially homogeneous dispersion. Preferred compositions comprise from about 1-20% by weight polymer, and preferably from about 2-10% by weight polymer, based upon the total weight of the composition taken as 100% by weight.

The solvent systems of this embodiment can include any solvent suitable for use in the microelectronic manufacturing environment. Preferred solvent systems include a solvent selected from the group consisting of propylene glycol monomethyl ether (PGME), propylene glycol monomethyl ether acetate (PGMEA), ethyl lactate, propylene glycol, n-propyl ether (PnP), cyclohexanone, γ-butyrolactone, and mixtures thereof. The solvent should be present in the composition at a level of from about 80-98% by weight, based upon the total weight of the composition taken as 100% by weight. Preferably, the solvent system has a boiling point of from about 100-160° C.

Any additional ingredients are also preferably dispersed in the solvent system along with the polymer. Examples of suitable additional ingredients include crosslinking agents, catalysts (e.g., PAGs), and surfactants. Preferred crosslinking agents include aminoplasts (e.g., POWDERLINK® 1174, Cymel® products), multifunctional epoxy resins (e.g., MY720, CY179MA, DENACOL), anhydrides, and mixtures thereof. When used, the crosslinking agent is present in the composition at a level of from about 10-50% by weight, and preferably from about 15-30% by weight, based upon the total weight of the solids in the composition taken as 100% by weight.

Suitable PAGs include both ionic and nonionic PAGs. Examples of particularly preferred PAGs include sulfonic acid-type PAGs such as those sold under the names CGI 261, CGI 1397, and CGI 1311 (CIBA Specialty Chemicals). When used, the PAG should be present in the composition at a level of from about 0.05-10% by weight, and preferably from about 2-8% by weight, based upon the total weight of the solids in the composition taken as 100% by weight.

EXAMPLES

The following examples set forth preferred methods in accordance with the invention. It is to be understood, however, that these examples are provided by way of illustration and nothing therein should be taken as a limitation upon the overall scope of the invention.

Example 1

Coating Formulation Made with Non-Light Absorbing Polymer

1. Preparation of Polymer A

In this procedure, 9.00 grams of cyclohexyl acrylate (obtained from Polysciences, Warrington, Pa.) and 5.01 grams of methacrylic acid (obtained from Aldrich, Milwaukee, Wis.) were added to a 250-ml, two-neck flask equipped with a stir bar, addition funnel with a nitrogen inlet, and condenser with a nitrogen outlet. These reagents were dissolved by adding 50.00 grams of PGME (obtained from Harcross, St. Louis, Mo.) and stirring under a nitrogen atmosphere. In a separate container, 3.00 grams of dicumyl peroxide (obtained from Acros, N.J.) were dissolved in 36.15 grams of PGME, and this solution was transferred to the addition funnel. The flask was immersed in an oil bath and heated until the solution started to reflux. Upon reflux, the dicumyl peroxide solution was added to the monomer solution. The resulting solution was refluxed for 24 hours. A very light yellow solution was obtained. The solution was cooled to room temperature and transferred to a Nalgene bottle for storage. Molecular weight analysis by gel permeation chromatography using tetrahydrofuran (obtained from Fisher, Fairlawn, N.J.) as the solvent gave a weight-averaged molecular weight of 17,600 Daltons. The optical properties of Polymer A are given in Table 1.

TABLE I

| n at 193 nm | k at 193 nm | n at 633 nm | Thickness (Å) | Cauchy A | Cauchy B |
|---|---|---|---|---|---|
| 1.6857 | 0.052 | 1.5 | 1410 | 1.4879 | 0.0049777 |

2. Preparation of Chromophore A

To synthesize Chromophore A, 10.77 grams of tris(2,3-epoxypropyl) isocyanurate (obtained from Aldrich, Milwaukee, Wis.), 19.23 grams of 3,7-dihydroxy-2-naphthoic acid (obtained from Aldrich, Milwaukee, Wis., 0.32 gram of tetrabutylphosphonium bromide (obtained from Aldrich, Milwaukee, Wis.), and 70.0 grams of PGME were added to a 250-ml, two-neck flask with stir bar, nitrogen inlet, and condenser. The flask was heated to 100° C. in an oil bath for 24 hours with stirring and nitrogen flow. After cooling, the chromophore was precipitated in approximately 500 ml of water, rinsed once with 100 ml of water, and dried in vacuum oven at 50° C. overnight.

3. Preparation of Vinyl Either Crosslinker

In this procedure, 25.15 g of tetramethylene glycol monovinyl ether, 22.91 g triethylamine, and 250 ml THF were added to a 500-ml, 2-necked flask equipped with a stir bar, addition funnel, condenser, and nitrogen inlet and outlet. The solution was stirred under a low flow of nitrogen and immersed in an ice water bath.

Next, 20.00 g of 1,3,5-benzenetricarbonyl trichloride were dissolved in 50 ml THF in a closed Erlenmeyer flask. This solution was transferred to the addition funnel. The contents of the addition funnel were added dropwise (over approximately 15 minutes) to the stirring solution of tetramethylene glycol monovinyl ether, triethylamine, and THF. A white precipitate formed upon contact. After addition was completed, the flask was removed from the ice water bath and stirred for approximately 2 hours at room temperature (about 20° C.). The flask was then immersed in an oil bath, and the slurry was heated and kept at reflux for 3 hours. The flask was removed from the heat and allowed to cool to room temperature.

The slurry was then suction filtered to give a yellow solution. The yellow solution was concentrated using a rotavap to remove the THF. The yellow oil was dissolved using 100 ml of diethylether. This solution was washed and extracted twice with 25-ml portions of aqueous, 12.5% tetramethylammonium hydroxide. This was followed with two washing and extraction steps with 50 ml of deionized water. The ether layer was allowed to settle out and collected. The ether layer was dried by mixing with 5.0 g of activated basic alumina. The mixture was stirred for 1 hour and gravity filtered. The clear yellow liquid was concentrated in a rotavap to give a yellow viscous oil.

The vinyl ether crosslinker, 1,3,5-benzenetricarboxylic acid, tris[4-(ethenyloxy)butyl]ester, had the following structure:

4. Preparation of Coating Formulation 1

A bottom anti-reflective coating formulation, Formulation 1, containing 1.4364 grams of Polymer A (14% solids in PGME), 0.6033 gram of Chromophore A, 39.5923 grams of PGME, 9.9058 grams of PGMEA (obtained from Harcross, St. Louis, Mo.), 0.4737 gram of vinyl ether crosslinker prepared above, 0.0232 gram of TPS-OH (obtained from Midori Kagaku, Japan), and 0.0523 gram BBI-106 (obtained from Midori Kagaku, Japan) was prepared and filtered through a 0.1-micron endpoint filter. The above formulation was spin-coated at 1,500 rpm onto a silicon substrate and then baked at 165° C. The optical constants at 193 nm were measured using a variable angle spectroscopic ellipsometer (VASE) and were determined to be n=1.557 and k=0.216. The film was rinsed with ethyl lactate ("EL," obtained from Harcross, St. Louis, Mo.) to test the film's resistance to the resist solvent, exposed to light from a mercury-xenon lamp, post-exposure baked at 130° C. for 90 seconds, and immersed in developer (MF-319, obtained from Rohm & Haas, MA) for 60 seconds. Table II below shows that bottom anti-reflective coating Formulation 1 had good solvent resistance, and that it can only be removed by an alkaline developer after exposure.

TABLE II

Bottom Anti-Reflective Coating Formulation 1 Film Properties.

| Initial Thickness (Å) | Thickness after 20 s EL rinse (Å) | % EL strip | Thickness after Exposure, PEB and Development (Å) | % change, exposed | Thickness after Development (Å) (no exposure) | % change, unexposed |
|---|---|---|---|---|---|---|
| 758 | 773 | 1.6 | 0 | 100 | 770 | 0.39 |

Example 2

Coating Formulation Made with Light-Absorbing Polymer

1. Preparation of Polymer B

In this procedure, 21.29 grains of styrene (obtained from Aldrich, St. Louis, Mo.), 26.17 grams of t-butyl methacrylate (obtained from Aldrich, Milwaukee, Wis.), 25.22 grams of methacrylic acid, and 491.84 grains of PGME were combined in a 1,000 ml, three-neck flask equipped with a magnetic stir bar, thermometer, addition funnel with nitrogen inlet, and condenser. A solution of 1.81 grams of 2,2'-azobis(2-methylpropionitrile) ("AIBN," obtained from Aldrich, Milwaukee, W), and 164.32 grams of PGME were added to the addition funnel. The flask was heated to 100° C. in an oil bath with stirring and nitrogen flow. After the contents of the flask reached 100° C., the AIBN solution was added to the reaction. Upon complete addition, the reaction was kept at 100° C. for 24 hours. After cooling, the polymer was precipitated in approximately 4 liters of hexanes, rinsed two times with 200 ml of hexanes, and dried in a vacuum oven at 50° C. overnight.

2. Preparation of Coating Formulation 2

To make the coating Formulation 2, 0.1006 gram of Polymer B, 0.302 gram of Chromophore A, 35.5438 grams of PGME, 8.8929 grains of PGMEA, 0.4737 grain of vinyl ether crosslinker prepared above, 0.0309 grain of triethanolamine quencher (obtained from Aldrich, Milwaukee, Wis.) in 10% PGME solution, and 0.0523 gram BBI-106 were combined and filtered through 0.1-micron endpoint filter. The formulation was spin-coated at 1,500 rpm onto a silicon substrate and then baked at 160° C. The optical constants at 193 nm were measured using a VASE and were determined to be n=1.536 and k=0.272. The film was rinsed with EL to test the film's resistance to the resist solvent, exposed to light from a mercury-xenon lamp, post-exposure baked at 130° C. for 90 seconds, and immersed in developer (MF-319) for 60 seconds. Table III below shows that the bottom anti-reflective coating had good solvent resistance, and that it could only be removed by an alkaline developer after exposure.

TABLE III

Bottom Anti-reflective Coating Formulation 2 Film Properties.

| Initial Thickness (Å) | Thickness After 20-s EL Rinse (Å) | % EL Strip | Thickness After Exposure, PEB, and Development (Å) | % Change, Exposed | Thickness After Development (unexposed) (Å) | % Change, Unexposed |
|---|---|---|---|---|---|---|
| 592 | 599 | 1.18 | 0 | 100 | 602 | 0.50 |

Example 3

Multi-Patterning Process Using Bottom Anti-Reflective Coating

To make bottom anti-reflective coating Formulation 3, 11.226 grams of Polymer B, 739.3 grams of PGME, 185.0 grams of PGMEA, 3.306 grams of a vinyl ether crosslinker prepared above, 0.859 grains of triethanolamine quencher in 10% PGME solution, and 0.330 grams of a mixture of 50% triphenyl sulfonium perfluoro butanesulfonate and 50% tris-(4-tert-butylphenyl)sulfonium perfluoro butanesulfonate (obtained from Aldrich, Milwaukee, Wis.) were combined and filtered through 0.1-micron endpoint filter. To test the multiple patterning process, the formulation was spin-coated at 1500 rpm onto a silicon substrate and then baked at 160° C. A 1-inch circular mask was placed over the film and then exposed using a mercury-xenon lamp, post-exposure baked at 130° C. for 90 seconds, immersed in developer (MF-319) for 60 seconds, rinsed with deionized water, and spin dried. The process left a circle printed on the substrate with a thickness of 54 nm. The exposed areas had no film remaining. This wafer was coated once again and processed two more times as described above. The resulting wafer had 3 circles printed on different locations on the substrate. This example demonstrates that all features printed before the last exposure remain on the substrate even after multiple exposures, bakes, developments, and rinses.

Example 4

Multiple-Patterning Process Using Bottom Anti-Reflective Coating

Using Formulation 3 described above, a double-patterning scheme as shown in FIG. 2 was demonstrated. The formulation was spin-coated at 1,500 rpm for 60 seconds onto a silicon substrate and then baked at 160° C. for 60 seconds. A photoresist (AR1682J, obtained from JSR Corp.) was spin-coated at 3,200 rpm for 60 seconds on top of the bottom anti-reflective coating. The resist and bottom anti-reflective films were then baked at 110° C. for 60 seconds. A test (contact) mask was placed on top of the wafer, and the films exposed under a mercury-xenon lamp for 5 seconds (at 20 mJ/sec using a 254-nm dose meter). The mask was then turned approximately 90 degrees from its previous orientation, and the films were exposed for another 5 seconds. The wafer was post-exposure baked at 110° C. for 60 seconds and then immersed in a developer (MF-319) for 60 seconds. The wafer was rinsed with deionized water and spin-dried. Overlapping images were observed, showing the imageability of both resist and bottom anti-reflective films.

Example 5

Multiple-Patterning Process Using Bottom Anti-Reflective Coating

Using Formulation 3 described above, a double-patterning scheme as shown in FIG. 3 was demonstrated. The formulation was spin-coated at 1,500 rpm for 60 seconds onto a silicon substrate and then baked at 160° C. for 60 seconds. A photoresist (AR1682J) was spin-coated at 3,200 rpm for 60 seconds on top of the bottom anti-reflective coating. The resist and bottom anti-reflective coating films were then baked at 110° C. for 60 seconds. A test (contact) mask was placed on top of the wafer, and the films exposed under a mercury-xenon lamp for 5 seconds (at 20 mJ/sec using a 254 nm dose meter). The wafer was post-expose baked at 110° C. for 60 seconds then immersed in developer (PD523, obtained from Moses Lake Industries) for 60 seconds. The wafer was rinsed with deionized water and spin-dried. A second coat of photoresist was applied (AR1682J, 3200 rpm, 60 sec.). The resist and bottom anti-reflective films were then baked again at 110° C. for 60 seconds. The mask was then turned approximately 90 degrees from its previous orientation, and then the films were exposed for another 5 seconds. The wafer was post-expose baked at 110° C. for 60 seconds and then immersed in developer for 60 seconds. The wafer was rinsed with deionized water and spin-dried. Overlapping images were observed, showing the imageability of both resist and anti-reflective films.

We claim:

1. A method of forming a microelectronic structure, said method comprising:
   (a) providing a substrate having a surface;
   (b) applying a photosensitive composition to form an imaging layer adjacent said substrate surface, said composition comprising a component selected from the group consisting of polymers, oligomers, and monomers;
   (c) crosslinking said component in said imaging layer to yield a crosslinked imaging layer, said crosslinked imaging layer having a k value of from about 0.2 to about 0.5;
   (d) exposing said crosslinked imaging layer to light to yield light-exposed portions in said layer;
   (e) contacting said layer with a developer so as to remove said light-exposed portions from said substrate, yielding a patterned imaging layer; and
   without heating said patterned imaging layer, applying a second photosensitive composition to form a second imaging layer on said patterned imaging layer.

2. The method of claim 1, wherein no heating occurs during (a), (b), (d), (e), or (f) other than a post-exposure bake after (d).

3. The method of claim 1, said wherein patterned imaging layer and substrate are not etched prior to (f).

4. The method of claim 1, wherein said patterned imaging layer remains intact during (f).

5. The method of claim 1, wherein (c) comprises thermally crosslinking said components.

6. The method of claim 1, wherein said second photosensitive composition is the same as the photosensitive composition of (a).

7. The method of claim 1, wherein said second photosensitive composition comprises a component selected from the group consisting of polymers, oligomers, and monomers, said method further comprising:
   (g) crosslinking said component in said second imaging layer;
   (h) exposing said second imaging layer to light to yield light-exposed portions in said second imaging layer; and
   (i) contacting said second imaging layer with a developer so as to remove said light-exposed portions from said substrate, yielding a second patterned imaging layer.

8. The method of claim 7, further comprising:
   (j) optionally repeated (f)-(i) one or more times; and
   (k) transferring the patterns of the patterned imaging layers to the substrate.

9. The method of claim 8, wherein said (k) comprises etching said patterned imaging layers and substrate.

10. The method of claim 1, wherein said photosensitive composition further comprises a photoacid generator, a crosslinker, and a solvent system, wherein said component, photoacid generator, and crosslinker are dissolved or dispersed in said solvent system.

11. The method of claim 10, wherein said crosslinker is a vinyl ether crosslinker.

12. A method of forming a microelectronic structure, said method comprising:
   (a) providing a substrate having a surface;
   (b) applying a photosensitive composition to form an imaging layer adjacent said substrate surface, said composition comprising a component selected from the group consisting of polymers, oligomers, and monomers;
   (c) crosslinking said component in said imaging layer to yield a crosslinked imaging layer, said crosslinked imaging layer having a k value of from about 0.2 to about 0.5;
   (d) exposing portions of said crosslinked imaging layer to light to yield light-exposed portions in said layer;
   (e) exposing additional portions of said crosslinked imaging layer to light to yield further light-exposed portions in said layer;
   (f) optionally repeating (e); and
   (g) contacting said layer with a developer so as to remove said light-exposed portions from said substrate, yielding a patterned imaging layer.

13. The method of claim 12, further comprising:
   (h) after (d) and prior to (e), contacting said layer with a developer so as to remove said light-exposed portions of (d) from said substrate, yielding a patterned imaging layer.

14. The method of claim 12, wherein no heating occurs during (a), (b), (d), (e), (f), or (g) other than a post-exposure bake after (d) and/or (e).

15. The method of claim 12, wherein said patterned imaging layer and substrate are not etched prior to (g).

16. The method of claim 12, wherein (c) comprises thermally crosslinking said components.

17. The method of claim 12, further comprising transferring the pattern of the patterned imaging layer to the substrate after (g).

18. The method of claim 17, wherein said transferring comprises etching said patterned imaging layers and substrate.

19. The method of claim 12, wherein said photosensitive composition further comprises a photoacid generator, a crosslinker, and a solvent system, wherein said component, photoacid generator, and crosslinker are dissolved or dispersed in said solvent system.

20. The method of claim 19, wherein said crosslinker is a vinyl ether crosslinker.

* * * * *

UNITED STATES PATENT AND TRADEMARK OFFICE
CERTIFICATE OF CORRECTION

PATENT NO. : 7,914,974 B2  
APPLICATION NO. : 11/839317  
DATED : March 29, 2011  
INVENTOR(S) : Douglas J. Guerrero and Ramil-Marcelo L. Mercado

Page 1 of 1

It is certified that error appears in the above-identified patent and that said Letters Patent is hereby corrected as shown below:

In the Claims:

Column 17, line 33, the text including the phrase "without heating said patterned imaging layer," should read: -- (f) without heating said patterned imaging layer, --

Signed and Sealed this
Third Day of December, 2013

Margaret A. Focarino
*Commissioner for Patents of the United States Patent and Trademark Office*